United States Patent
Schaefer

(10) Patent No.: US 7,321,240 B2
(45) Date of Patent: Jan. 22, 2008

(54) DRIVER CIRCUIT FOR BINARY SIGNALS

(75) Inventor: Andre Schaefer, München (DE)

(73) Assignee: Infineon Technologies AG, Munich (DE)

( * ) Notice: Subject to any disclaimer, the term of this patent is extended or adjusted under 35 U.S.C. 154(b) by 68 days.

(21) Appl. No.: 11/316,379

(22) Filed: Dec. 22, 2005

(65) Prior Publication Data

US 2006/0170456 A1    Aug. 3, 2006

(30) Foreign Application Priority Data

Dec. 22, 2004   (DE) ............... 10 2004 061 738

(51) Int. Cl.
*H03K 19/0175*   (2006.01)
(52) U.S. Cl. ............... 326/82; 326/83; 326/27; 326/87; 327/175
(58) Field of Classification Search ............... 326/17, 326/27, 29, 82, 83, 87; 327/175
See application file for complete search history.

(56) References Cited

U.S. PATENT DOCUMENTS

| | | | |
|---|---|---|---|
| 5,694,065 A | 12/1997 | Hamasaki et al. | |
| 5,898,321 A * | 4/1999 | Ilkbahar et al. | 326/87 |
| 5,959,493 A | 9/1999 | Cassista | |
| 6,084,432 A * | 7/2000 | Dreps et al. | 326/83 |
| 6,573,753 B1 | 6/2003 | Snyder | |

* cited by examiner

*Primary Examiner*—Daniel Chang
(74) *Attorney, Agent, or Firm*—Patterson & Sheridan, L.L.P.

(57) ABSTRACT

The invention relates to a driver circuit for binary signals, said circuit having two branch circuits which are connected in parallel with one another between an input node and an output node, the first of which branch circuits contains an output stage which, in response to the first binary value of a binary signal that is applied to the input node, connects the output node to a first logic potential via a first nonreactive resistor, and the second of which branch circuits contains an output stage which, in response to the second binary value of the binary signal that is applied to the input node, connects the output node to a second logic potential via a second nonreactive resistor. According to the invention, the driver circuit contains a duty ratio control device for setting the signal propagation time from the input node to the output stage of one branch circuit relative to the signal propagation time from the input node to the output stage of the other branch circuit.

13 Claims, 2 Drawing Sheets

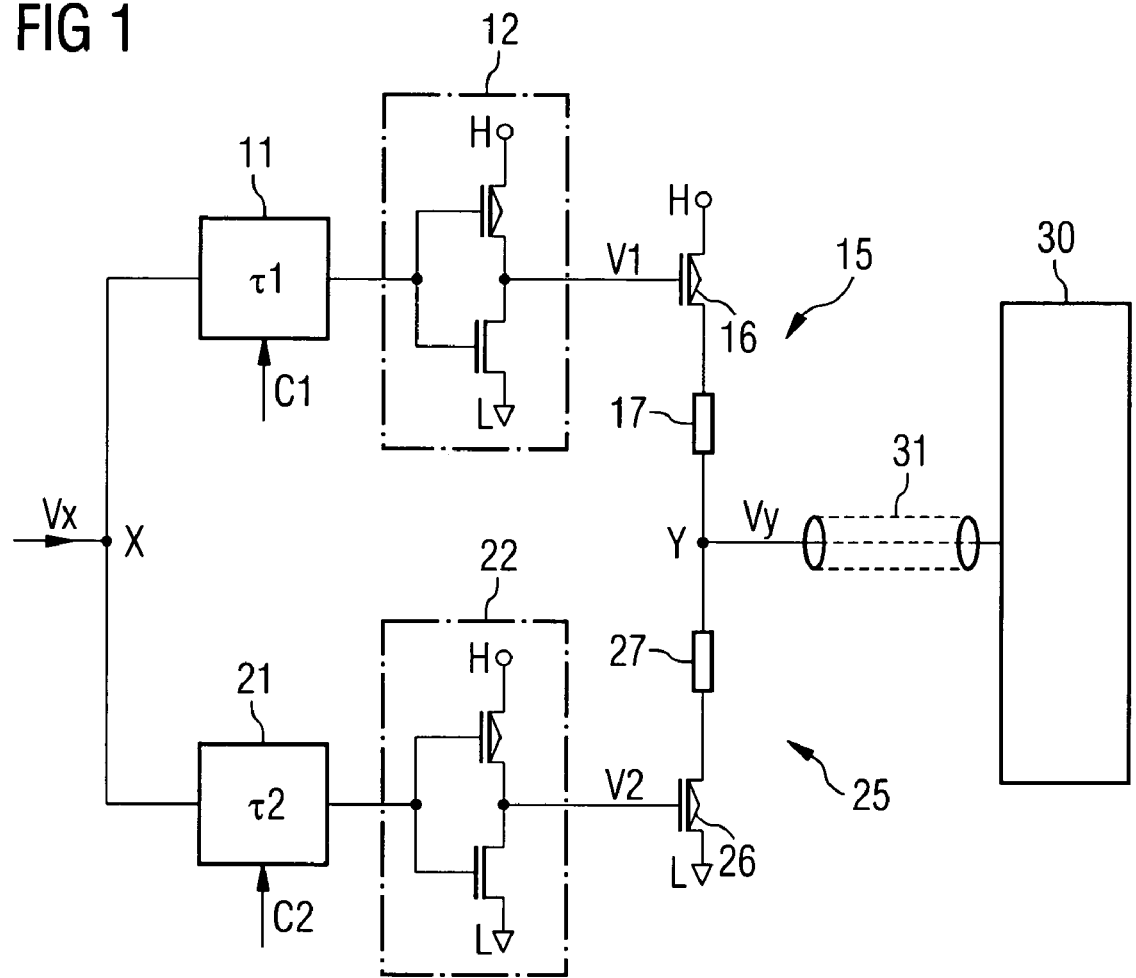
FIG 1
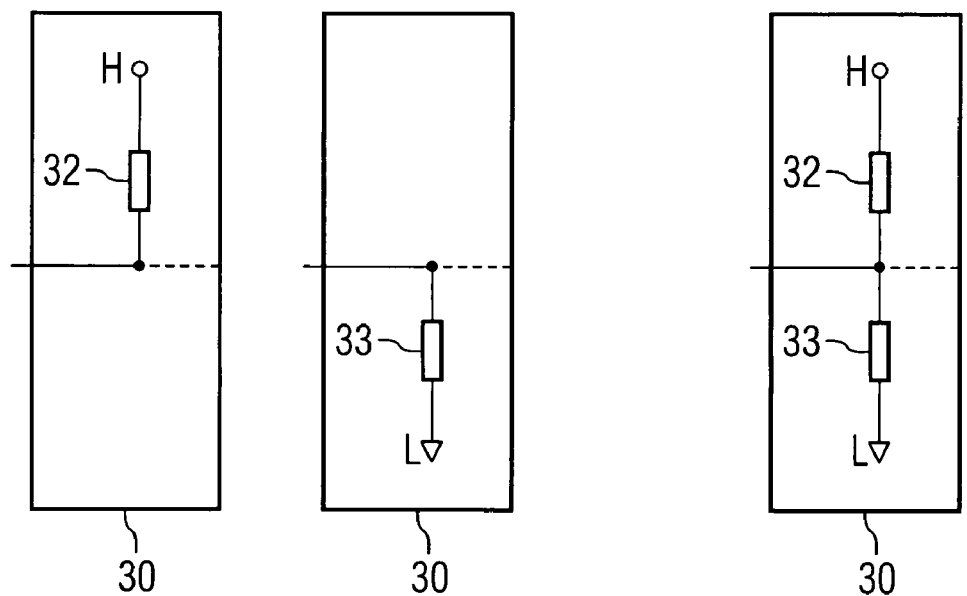

DRIVER CIRCUIT FOR BINARY SIGNALS

CROSS-REFERENCE TO RELATED APPLICATIONS

This application claims foreign priority benefits under 35 U.S.C. §119 to co-pending German patent application number DE 10 2004 061 738.4, filed 22 Dec. 2004. This related patent application is herein incorporated by reference in its entirety.

BACKGROUND OF THE INVENTION

1. Field of the Invention

The invention relates to a driver circuit for binary signals. The invention relates to a driver circuit for binary signals, said circuit having two parallel driver branches. A preferred, but not exclusive, area of application of the invention is the amplification of binary data signals and/or control signals at the outputs of digital modules, particularly at the outputs of DRAM memory circuits and associated memory controllers.

2. Description of the Related Art

A driver circuit for amplifying binary signals which represent serial bits of an item of information usually contains controllable switching elements which are driven by the binary signal to be amplified in order to connect an output node either to a first or to a second defined logic potential depending on the binary state of this signal. The controllable switching elements may be two on/off switches, preferably two field effect transistors (FETs) of a complementary conduction type (one P-FET and one N-FET), which are driven by the binary signal to be amplified via separate branches and which form the output stages of the branches. If the driving binary signal has the first binary value (e.g. "1"), only the first switch (e.g. the P-FET) is on in order to pull the output node to the first logic potential (e.g. the more positive potential "H"). If the driving binary signal has the second binary value (e.g. "0"), only the second switch (e.g. the N-FET) is on in order to pull the output node to the second logic potential (e.g. the more negative potential "L"). During the transition from one binary value to the other, the conductivity of the two switches changes in the opposite sense, both switches temporarily being on to a greater or lesser extent. In many cases, suitable preamplifiers are respectively connected upstream of the output stages of the two driver branches.

In particular, if driver circuits of the above-described type are used as output amplifiers of a module in order to transmit the amplified signals to a load (receiver) via a line, the connection (which is established by means of the switching elements) of the output node to the respective logic potential is effected via a respective nonreactive resistor. These resistors are referred to as "pull-up" or "pull-down" resistors depending on whether they lead to the H potential or to the L potential. The termination of such driver circuits, that is to say the termination of the line at the load or receiver end, is then likewise effected resistively, either "asymmetrically", that is to say at only one of the logic potentials via one terminating resistor, or "symmetrically", that is to say at the H potential and the L potential via two terminating resistors. The pull-up, pull-down and terminating resistors are dimensioned, taking into account the effective characteristic impedance of the line, in such a manner that there is no reflection as far as possible.

Inevitable process fluctuations when manufacturing the driver circuit may result in the form and the timing of the edges when passing through the driver circuit not only being influenced differently from circuit to circuit but also in this influence being different for edges of differing polarity. By way of example, the threshold point (switching threshold) and the slope of the characteristic curves of the switching elements in the output stages of the two branches may thus differ from one another. One consequence of this asymmetry may be that the edges of one polarity (e.g. the "rising" edges which are changing to the H potential) of the output signal are "slower", i.e. last longer or are delayed to a greater extent, than the edges of the other polarity (e.g. the "falling" edges which are changing to the L potential). Time displacement differences between rising and falling edges in the output signal may also arise if preamplifiers which are inserted into the two driver branches also have asymmetries. All of these effects are of concern, in particular, when the switching elements in the output stages (and also in any possible preamplifiers) are FETs of a complementary conduction type.

These effects lead to "duty ratio distortion" in the output signal; that is to say the amplitude/time integrals of signal excursions of one polarity (which represent the "1" bits, for example) are different than the amplitude/time integrals of the signal excursions of the other polarity ("0" bits). However, the ratio of these integrals should, on average, be equal to 1. Otherwise an undesirable offset occurs in the reception of the signals at the load, said offset additionally fluctuating depending on the composition of the bit sequence.

SUMMARY OF THE INVENTION

The object of the invention is to design a driver circuit for binary signals in such a manner that the duty ratio (duty cycle) of the driven signal can be adjusted.

Accordingly, the invention is implemented in a driver circuit containing two branch circuits which are connected in parallel with one another between an input node and an output node, the first of which branch circuits contains an output stage which, in response to the first binary value of a binary signal that is applied to the input node, connects the output node to a first logic potential via a first nonreactive resistor, and the second of which branch circuits contains an output stage which, in response to the second binary value of the binary signal that is applied to the input node, connects the output node to a second logic potential via a second nonreactive resistor. According to the invention, provision is made of a duty ratio control device for setting the signal propagation time from the input node to the output stage of one branch circuit relative to the signal propagation time from the input node to the output stage of the other branch circuit.

The opportunity (provided according to the invention) to relatively displace the signal propagation times of the two driver branches makes it possible to vary the length of the overlap intervals in which both output stages are simultaneously in the "on" state, with the result that the period of time during which the output node in the driver circuit is connected to the two logic potentials via the respective pull-up and pull-down resistor is varied. At the same time as this variation, overlap intervals in which the two output stages are simultaneously in the "off" state are inevitably produced, with the result that the output node in the driver circuit is not connected to any of the logic potentials. In the case of terminated systems, all of the designer's efforts have hitherto been aimed at avoiding such OFF overlaps in driver circuits.

The invention is based on the insight that a defined temporal profile of the potential at the output node is respectively produced in the overlap intervals. This profile depends on a plurality of factors. Firstly, the profile depends on whether the on states of the output stages overlap in the overlap interval ("ON" overlap) or whether the off states overlap ("OFF" overlap). Secondly, the profile depends on the type of termination of the driver circuit. Thirdly, the profile depends on the initial potential at the output node at the beginning of the overlap, that is to say on whether the overlap interval falls on a rising edge or a falling edge of the output signal.

It can thus be expected, in the interval of an ON overlap, that the output potential will change from the level which existed up to then to the central potential (H−L)/2 at a speed that is greater than if that output stage which has hitherto been on were switched off and only the other output stage were switched on. This applies to both symmetrical and asymmetrical termination.

In the case of asymmetrical termination, it can be expected, in the interval of an OFF overlap, that the output potential which existed up to then will be pulled to the termination potential. In the case of symmetrical termination, in the interval of an OFF overlap, the output potential will change from the logic potential (L or H) which existed up to then to the central potential (H−L)/2 at a speed that is less than if that output stage which has hitherto been on were switched off and only the other output stage were switched on.

Selecting the direction and the extent of the relative displacement of the signal propagation times for the two driver branches makes it possible, in a simple and surprising manner, to influence the duty ratio of the output signal in a specific manner. An existing duty ratio which is not equal to 1 can thus be approximated to the value 1 by selecting the displacement direction in such a manner that the ON overlaps appear early at the points of the "slower" edges in order to "accelerate" these edges at the beginning of these overlaps on their way to the center potential. The OFF overlaps are then inevitably at the points of the edges which are "not so slow", with the result that these edges are either not started early (in the case of asymmetrical termination) or are started early but are not accelerated to the center potential but rather are decelerated (in the case of symmetrical termination). The extent of the overlap may then be selected as desired in such a manner that a duty ratio of exactly equal to 1 is obtained.

The duty ratio control device according to the invention can thus be used, without any problems, in the layouts of known driver circuits which contain a plurality of parallel output drivers (which are driven in a temporally staggered manner) in order to set the edge steepness in each of the two branches. This internal temporal staggering within the branches is not influenced by the duty ratio control device according to the invention.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 shows the circuit diagram of a simple driver circuit having a duty ratio control device according to the invention.

DETAILED DESCRIPTION OF THE PREFERRED EMBODIMENT

Figure 2:
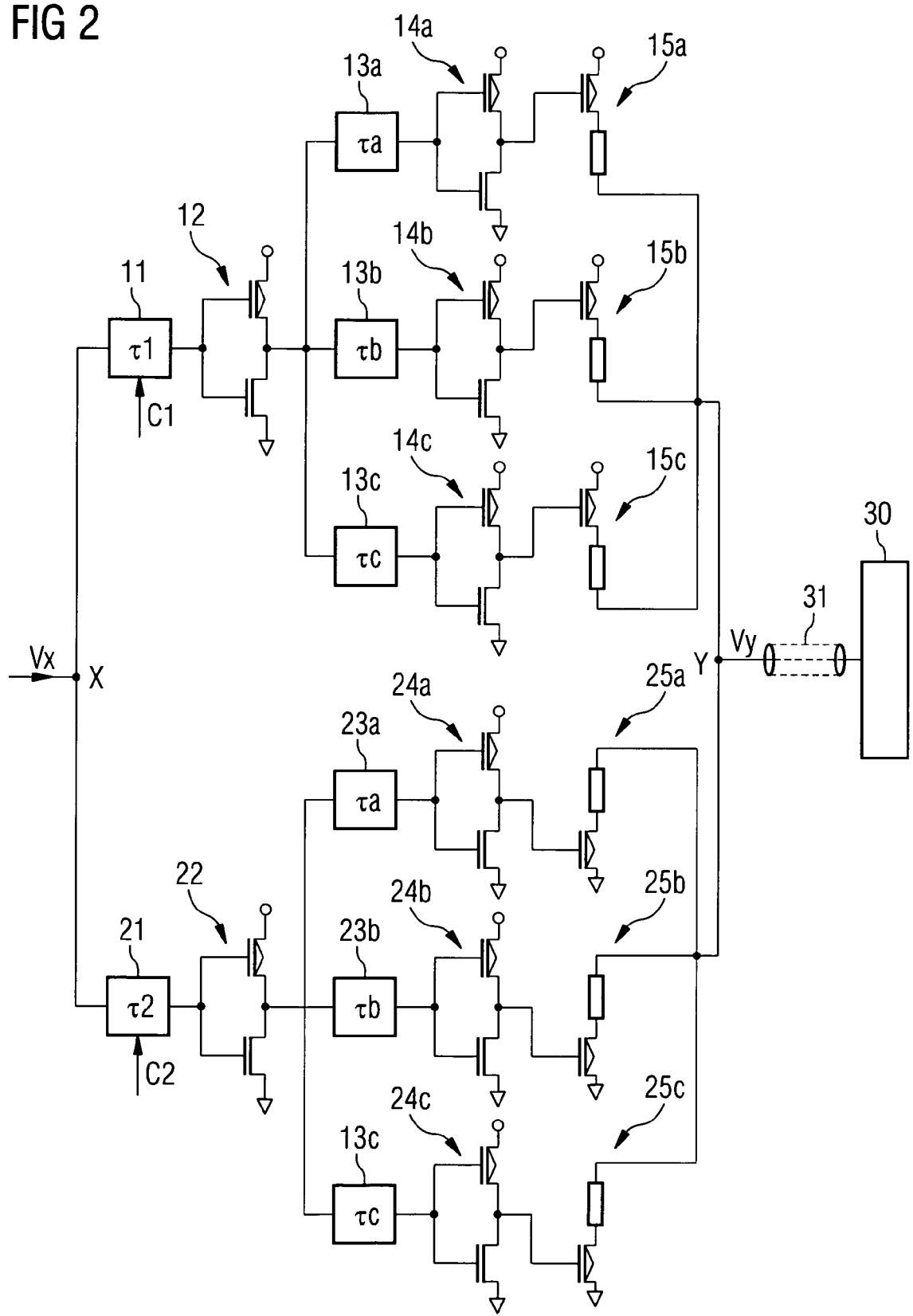
FIG. 2 shows the circuit diagram of a driver circuit containing a plurality of parallel output stages which are driven in a temporally staggered manner in each of the two branches and a duty ratio control device according to the invention.

The driver circuit shown in FIG. 1 comprises two parallel branches between an input node X and an output node Y. The "top" branch in FIG. 1 contains an output stage 15 having a P-FET 16 whose channel (source-drain path) is connected in series with a pull-up resistor 17 between the output node Y and a source of a first logic potential H. The "bottom" branch contains an output stage 25 having an N-FET 26 whose channel (source-drain path) is connected in series with a pull-down resistor 27 between the output node Y and a source of a second logic potential L which is more negative than the H potential. The output node Y may be, for example, one of the external data connections of a module which is integrated on a chip, for example a DRAM memory module.

During operation, the output node Y is connected, via a line 31, to a load which is illustrated in the form of a block 30 and may be, for example, a reception circuit in another module, for instance in a memory controller. The line 31 is terminated resistively at the load 30. Various types of termination are customary for this purpose, as is shown in the bottom part of FIG. 1. In the case of symmetrical termination, the line 31 is connected to the H potential and to the L potential via a respective nonreactive terminating resistor 32 and 33. In the case of asymmetrical termination, the line is connected to only one of the potentials (H or L) via a terminating resistor 32 or 33; in the case shown, the output stages 15 and 25 then form a so-called "pseudo-open-drain" amplifier.

The FETs 16 and 26 in the two output stages form two controllable switches whose conductivity depends on the potential V1 or V2 at the respective gate. The P-FET 16 is off if its gate potential V1 is close to the value H. If the potential V1 changes in the direction of the potential L, the P-FET 16 turns on, as of a threshold value H−V1=Vth, to an increasing extent until it is completely switched on ("ON" state). In a complementary manner, the N-FET 26 is off if its gate potential V2 is close to the value L; if V2 changes in the direction of the potential H, the N-FET 26 turns on, as of a threshold value L+V1=Vth, to an increasing extent until it is completely switched on.

During operation, a binary input signal $V_x$, which represents a sequence of bits by changing between two discrete levels in order to represent the binary values "0" and "1", is received at the input node X. These two levels are essentially equal to the logic potentials H and L. The input node X is connected to the gates of the two FETs 16 and 26 via a respective signal path in the top and bottom branches.

According to the invention, a controllable delay device 11 and 21 whose delay time τ1 and τ2 can be varied by means of a control signal C1 and C2 is inserted in the signal path of each branch. One or more preamplifier stages may be optionally respectively provided in the signal paths, for example upstream and/or downstream of the delay devices. FIG. 1 depicts such a preamplifier 12 and 22 for each branch within a dashed border.

For the purpose of the description, the case in which the preamplifiers 12 and 22 are not present shall be considered for the time being. It shall also be assumed first of all that the delay times τ1 and τ2 are equal to one another (τ1=τ2). In this case, the input signal $V_x$ reaches the gates of the two complementary FETs 16 and 27 at the same time, with the result that these FETs are driven exactly in synchronism. A "rising" (changing from L to H) edge of the input signal $V_x$ thus causes the N-FET 26 to change from its OFF state to its ON state, while the P-FET 16 simultaneously changes from its ON state to its OFF state; the potential $V_y$ at the output node Y is thus pulled from the value H to the value L, it being possible for the ON states of the two FETs to temporarily overlap for a certain period of time. A "falling" (changing from H to L) edge of the input signal $V_x$ causes the P-FET 16 to change from its OFF state to its ON state, while the N-FET 26 simultaneously changes from its ON state to its OFF state; the potential $V_y$ at the output node Y is thus pulled from the value L to the value H, it being possible for the ON states of the two FETs to also temporarily overlap here for a certain period of time. The output signal $V_y$ is thus an inverted version of the input signal $V_x$.

The ideal case is that the characteristic curves of the two FETs are exactly symmetrical to one another (same magnitude of the threshold voltage $V_{th}$ and exact centrosymmetry in the shape of the P-FET characteristic curve with respect to the shape of the N-FET characteristic curve). The two driver stages then operate in an exactly complementary and symmetrical manner: the same overlap time of the ON states of the two FETs respectively results on the rising and falling edges, the OFF states of the two FETs overlap neither on the rising edge nor on the falling edge, and all edges of the input signal $V_x$ are reflected in the edges of the output signal $V_y$, with the same transfer characteristic both as regards their shape and as regards their delay.

As described further above, the ideal characteristic curve symmetry cannot always be achieved in practice, thus leading to the abovementioned duty ratio distortions in the output signal $V_y$. These distortions can be corrected using the controllable delay devices 11 and 12 by setting the delay times τ1 and τ2 to different values. The greater the magnitude |Δτ|=|τ1−τ2| of the relative displacement, the longer the overlap period of the ON states of the two FETs on all edges of a particular polarity, the duration of OFF overlaps which occur on all edges of the other polarity simultaneously also being extended. The edge polarity which is assigned to the extended ON overlaps and the edge polarity which is assigned to the OFF overlaps depend on the direction of the relative displacement, that is to say on the mathematical sign of the expression Δτ=τ1−τ2.

Since, as described further above, the ON overlaps influence the edge speed differently to the OFF overlaps, the duty ratio of the output signal $V_y$ will thus change as a function of the relative displacement Δτ. As has likewise been described, the appearance of this function depends on the termination. The function may be determined empirically from case to case. However, it is not actually necessary to have prior knowledge of this function. It may suffice, in practice, when applying an input signal $V_x$, to vary the relative displacement between a negative and a positive extreme value using a control range, to measure the duty ratio of the output signal $V_y$ in this case and then to fix the extent of displacement Δτ at that value at which the desired duty ratio (e.g. =1) is obtained. This may be effected using an automatic control loop, for example in an adjustment phase when initializing the module which contains the driver circuit. In this case, a standardized input signal $V_x$ can be applied, for example a sequence of regularly changing binary levels corresponding to the sequence of binary digits "010101 . . . ".

The method of operation and the desired success of the duty ratio control device 11, 12 according to the invention are also achieved, of course, in the manner described when one or more preamplifiers are inserted in each branch of the driver circuit, irrespective of the specific design of these preamplifiers. FIG. 1 illustrates, by way of example, two customary preamplifiers 12 and 22 each containing a P-FET and an N-FET, the gates of which are driven by the binary signal to be amplified and which are arranged between the first and second logic potentials H and L in such a manner that the amplifier output is pulled to either H or L depending on the binary value of the driving signal. In the case shown, these amplifiers are simple CMOS amplifiers. Asymmetries which contribute to the duty ratio distortion in the output signal $V_y$ may also occur in the preamplifiers. However, since the duty ratio control device 11, 12 influences the duty ratio (which results at the end) of the output signal $V_y$, irrespective of the source of the duty ratio distortions, the technical success of the invention is independent of the number and quality of any preamplifiers which may be present.

As already mentioned further above, a duty ratio control device according to the invention may also be advantageously used in driver circuits which contain a plurality of parallel output drivers (which are driven in a temporally staggered manner) in each of the two branches. Driver circuits of this type are known per se, and FIG. 2 illustrates the manner in which such a driver circuit is equipped according to the invention. In this figure, the same circuit symbols as in FIG. 1 are indicated for P-FETs, N-FETs, the H potential and the L potential.

In the exemplary embodiment shown in FIG. 2, the output stage of each of the two branches contains three output drivers. The top branch contains the three drivers 15a, 15b and 15c, the outputs of which are connected to the output node Y and each of which may be designed like the output stage 15 shown in FIG. 1. Provided in the bottom branch are three output drivers 25a, 25b and 25c, the outputs of which are connected to the output node Y and each of which may be designed like the output stage 25 shown in FIG. 1. During operation, the output node Y is connected to a terminating load 30 via a line 31, as in the embodiment shown in FIG. 1.

The "driver strength" of the output stages is determined by the strength and number of effective output drivers within the stage. Driving the drivers in a temporally staggered manner within the stage results in the drivers being turned on or off gradually in succession rather than simultaneously on each edge of the drive signal, with the result that the effective driver strength of the stage increases or decreases gradually. As a result, the edges of the output signal appear, as it were, in low-pass-filtered form in order to reduce the frequency bandwidth of the output signal.

In order to effect this temporally staggered driving, an adjustable delay element 13a, 13b, 13c and 23a, 23b, 23c is situated in the drive path of each of the output drivers 15a, 15b, 15c and 25a, 25b, 25c (that is to say in the signal path that leads to the gate of the relevant FET). A respective preamplifier 14a, 14b, 14c and 24a, 24b, 24c may be optionally arranged between each of these delay elements and the associated output driver. This is known per se, a control device being provided in order to set the respectively desired staggering of the delay times τa, τb, τc of the three delay elements 13a, 13b, 13c in the top branch and to set the same delay times τa, τb, τc of the three delay elements 23a, 23b, 23c in the bottom branch in the same sense. The number of output drivers in each branch (and thus the number of associated delay elements) may also be different to that illustrated in FIG. 2; an odd number of output drivers which are driven in a staggered manner is preferably provided in each branch.

By contrast, the duty ratio control device according to the invention ensures that the timing of the drive signal in the top branch is set relative to the timing of the drive signal in the bottom branch. In the driver circuit shown in FIG. 2, the duty ratio control device is formed by the two delay devices 11 and 21 which are additionally provided, can be controlled separately and the first of which is arranged in the top branch upstream of the node where this branch subbranches into the three signal paths which lead to the output drivers 15a, 15b, 15c via the "time-staggering" delay elements 13a, 13b, 13c. The other delay device 21 is arranged in the bottom branch upstream of the node at which this branch subbranches into the three signal paths which lead to the output drivers 25a, 25b, 25c via the "time-staggering" delay elements 23a, 23b, 23c. A preamplifier 12 and 22 may be optionally connected downstream of each of these delay devices 11 and 21.

The settings of the duty ratio control device 11, 21 in the circuit shown in FIG. 2 precisely correct duty ratio distortions in the output signal $V_y$ in the manner described with reference to FIG. 1. In this case, the internal temporal staggering within the branches is not changed, with the result that the desired "low-pass" effect of this temporal staggering is retained.

While the foregoing is directed to embodiments of the present invention, other and further embodiments of the invention may be devised without departing from the basic scope thereof, and the scope thereof is determined by the claims that follow.

What is claimed is:

1. A driver circuit, comprising:
   a first branch circuit disposed between an input node and an output node; wherein the first branch circuit includes a first output stage;
   a second branch circuit disposed between the input node and the output node and connected in parallel with to the first branch circuit, wherein the second branch circuit contains a second output; and
   a duty ratio control device configured to set a signal propagation time of the binary signal from the input node to the first output stage relative to a signal propagation time of the binary signal from the input node to the second output stage, wherein the duty ratio control device comprises:
   a first controllable delay device arranged in the first branch circuit; and
   a second controllable delay device arranged in the second branch circuit.

2. The driver circuit of claim 1, wherein the controllable delay devices are individually controllable.

3. The driver circuit of claim 2, further comprising:
   a first preamplifier connected between the input node and the first controllable delay device; and
   a second preamplifier connected between the input node and the second controllable delay device.

4. A driver circuit, comprising:
   a first branch circuit disposed between an input node and an output node, the first branch circuit comprising:
   a first output stage comprising a first plurality of parallel output drivers, each of which, in response to a first binary value of a binary signal that is applied to the input node, connects the output node to a first logic potential via a respective resistor; and
   upstream of the first plurality of output drivers, a first controllable time-staggering device for staggering the input signal to the respective output drivers;
   a second branch circuit disposed between the input node and the output node and connected in parallel with to the first branch circuit; wherein second branch circuit comprises:
   a second output stage comprising a second plurality of parallel output drivers, each of which, in response to a second binary value of the binary signal that is applied to the input node, connects the output node to a second logic potential via a respective resistor; and
   upstream of the second plurality of output drivers, a second controllable time-staggering device for staggering the input signal to the respective output drivers; and
   a duty ratio control device for setting a signal propagation time of the binary signal from the input node to the first output stage relative to a signal propagation time of the binary signal from the input node to the second output stage, wherein the duty ratio control device comprises
   a first controllable delay device arranged in the first branch circuit between the input node and the first controllable time-staggering device; and
   a second controllable delay device arranged in the second branch circuit between the input node and the second controllable time-staggering device.

5. The driver circuit of claim 4, wherein the controllable delay devices are individually controllable.

6. The driver circuit of claim 4, further comprising:
   a first preamplifier connected between the input node and the first controllable delay device; and
   a second preamplifier connected between the input node and the second controllable delay device.

7. A method for operating a driver circuit, comprising:
   inputting a binary signal at an input node connected to:
   (i) a first branch circuit disposed between the input node and an output node; wherein the first branch circuit includes a first output stage;
   (ii) a second branch circuit disposed between the input node and the output node and connected in parallel with to the first branch circuit; wherein the second branch circuit contains a second output; and
   responsive to a control signal input to a duty ratio control device, adjusting relative signal characteristics between the binary signal at the input node and the binary signal at the output node, wherein the duty ratio control device comprises:
   a first controllable delay device arranged in the first branch circuit; and
   a second controllable delay device arranged in the second branch circuit; and wherein adjusting the relative signal characteristics comprises adjusting the delay imposed on the input signal by the respective controllable delay devices.

8. The method of claim 7, wherein the controllable delay devices are individually controllable.

9. The method of claim 7, further comprising:
   amplifying the signal in the first branch circuit with a first preamplifier connected between the input node and the first controllable delay device; and
   amplifying the signal in the second branch circuit with a second preamplifier connected between the input node and the second controllable delay device.

10. An integrated circuit comprising a driver circuit, the driver circuit comprising:
   a first branch circuit disposed between an input node and an output node;
   a second branch circuit disposed between the input node and the output node and connected in parallel to the first branch circuit; and
   a duty ratio control device comprising:
      a first controllable delay device arranged in the first branch circuit; and
      a second controllable delay device arranged in the second branch circuit.

11. The integrated circuit of claim 10, wherein the controllable delay devices are individually controllable.

12. The integrated circuit of claim 10, further comprising:
   a first preamplifier connected between the input node and the first controllable delay device; and
   a second preamplifier connected between the input node and the second controllable delay device.

13. The integrated circuit of claim 10,
   wherein the first branch circuit includes a first output stage which, in response to a first binary value of the binary signal that is applied to the input node, connects the output node to a first logic potential via a first resistor,
   wherein the second branch circuit includes a second output stage which, in response to a second binary value of a binary signal that is applied to the input node, connects the output node to a second logic potential via a second resistor; and
   wherein the duty ratio control device is configured to set a signal propagation time of the binary signal from the input node to the first output stage relative to a signal propagation time of the binary signal from the input node to the second output stage.

* * * * *